United States Patent
Satoh

(10) Patent No.: US 6,338,980 B1
(45) Date of Patent: Jan. 15, 2002

(54) METHOD FOR MANUFACTURING CHIP-SCALE PACKAGE AND MANUFACTURING IC CHIP

(75) Inventor: Tetsuo Satoh, Tanashi (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/630,682

(22) Filed: Aug. 1, 2000

(30) Foreign Application Priority Data

Aug. 31, 1999 (JP) .......................................... 11-229084

(51) Int. Cl.[7] .......................... H01L 21/44; H01L 21/48; H01L 21/50
(52) U.S. Cl. .......................... 438/106; 438/110; 438/114
(58) Field of Search ................... 438/106, 110, 438/114

(56) References Cited

U.S. PATENT DOCUMENTS

| 5,888,883 | A | * | 3/1999 | Sasaki et al. |
| 5,897,337 | A | * | 4/1999 | Kata et al. |
| 6,060,373 | A | * | 5/2000 | Saitoh |
| 6,080,602 | A | * | 6/2000 | Tani et al. |
| 6,130,111 | A | * | 10/2000 | Ikuina et al. |
| 6,136,137 | A | * | 10/2000 | Farnworth et al. |
| 6,153,448 | A | * | 11/2000 | Takahashi et al. |
| 6,177,295 | B1 | * | 1/2001 | De Samber et al. |
| 6,221,751 | B1 | * | 4/2001 | Chen et al. |

* cited by examiner

Primary Examiner—John F. Niebling
Assistant Examiner—Josetta I. Jones
(74) Attorney, Agent, or Firm—Kanesaka & Takeuchi

(57) ABSTRACT

In manufacturing a chip-scale package, a plurality of pads is formed in predetermined positions on an active face of an IC wafer, and projected electrodes are formed on the pads. Then, a groove is formed on the active face of the IC wafer along a line that the IC wafer is divided into individual pieces, and a protective resin is applied on the active face of the IC wafer including the groove. Thereafter, an adhesive member is applied on the active face on which the protective resin is applied, and an inactive face of the IC wafer which is fixed by the adhesive member is ground until the protective resin in the groove appears at the inactive face of the IC wafer. Then, the adhesive member applied to the active face is removed, and an adhesive member is applied to a ground face of the IC wafer, which has been ground in the grinding step. The protective resin is diced along the line into chip-scale packages in a state where the IC wafer is fixed by the adhesive member, and after that, the adhesive member applied to the ground face is removed.

20 Claims, 11 Drawing Sheets

4 : groov

5 : protective resin

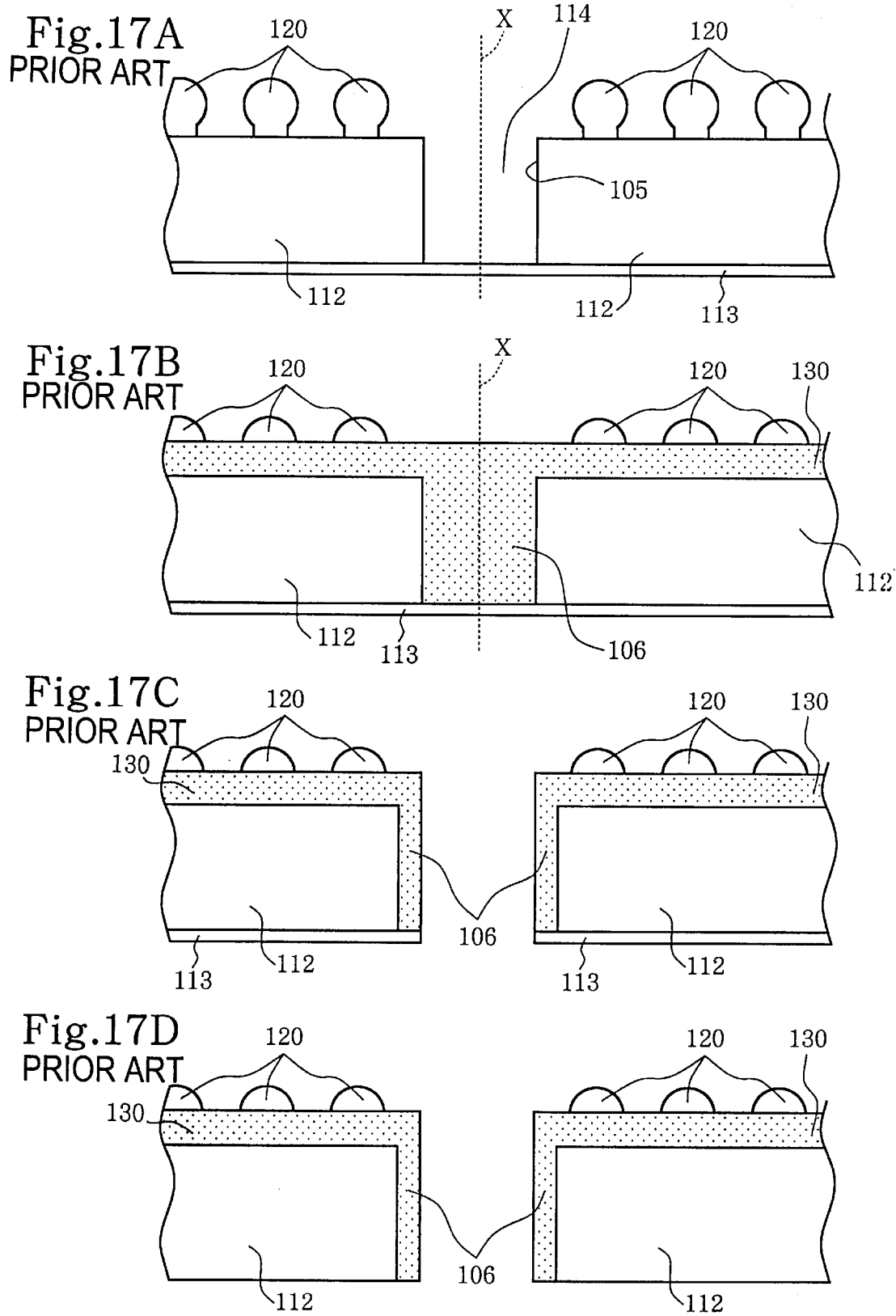

METHOD FOR MANUFACTURING CHIP-SCALE PACKAGE AND MANUFACTURING IC CHIP

TECHNICAL FIELD

The present invention relates to a method for manufacturing a semiconductor device and an IC chip which can meet demand of small-sizing and thinning. More particularly, the invention relates to a method for manufacturing a chip-scale package and an IC chip, which can manufacture a thin chip-scale package by back grinding in a state where an active face of an IC wafer is protected.

BACKGROUND ART

In recent years, with the advent of single-unit video camera-recorder, portable telephone, and the like, a portable device on which a small-sized package having almost the same size as that of a bare chip, what is called, a CSP (Chip-Scale Package) has appeared. Recently, the CSP which is formed by coating a protective resin on an IC chip is being developed rapidly and it realizes a small, thin, and high-density semiconductor device.

Japanese Patent Application Laid-Open No. 10-79362 discloses a technique regarding a method for manufacturing a chip-scale package to satisfy the demand of small-sizing and thinning.

The technique will be described briefly hereinbelow.

A semiconductor device is manufactured by, generally, a semiconductor device forming process, a bump forming process, a resin sealing process, a projected electrode exposing process, a dicing process, and the like.

In the publication, a method for manufacturing a semiconductor device is disclosed as the nineteenth embodiment.

FIGS. 16A to 16C show the method for manufacturing a semiconductor device disclosed as the nineteenth embodiment.

In FIG. 16A, before the resin sealing process, a relatively wide groove 105 for dicing is formed in a part in a substrate 116 (wafer on which a number of semiconductor devices are formed) to be diced in a post process. The groove 105 is formed so that a part of the substrate 116 remains on the bottom of the groove 105. The width of the groove 105 is set so as to be wider than at least the width of a dicer 129.

In the resin sealing process, a resin layer 130 is formed on the substrate 116, the groove 105 is filled with a sealing resin to form a resin layer 106. After completion of the resin sealing process, a dicing process is performed. In the process, as shown in FIG. 16B, the substrate 116 is diced into pieces by using the dicer 129 in a dicing position X in the groove 105 filled with the resin layer 106. FIG. 16C shows the diced state of the substrate 116.

In the dicing process, the dicing process is performed in the groove 105 in which the resin layer 106 is formed, and the resin layer 106 becomes thicker than the other resin layer 130 on the active face. Consequently, the mechanical strength can be enhanced.

Since the resin layer 106 is more flexible than the substrate 116, a stress applied on the substrate 116 can be absorbed. In the dicing process, therefore, it can prevent occurrence of cracks in the substrate 116 and the resin layer 130. Also, the manufacturing yield of the semiconductor device can be increased.

At the time point of completion of the dicing process, the resin layer 106 is exposed on a side face of the substrate 116.

In a part corresponding to the bottom of the groove 105, the diced face of the substrate 116 is exposed. In the event of carrying a semiconductor device, exposed parts in the resin layer 106 are held by using a handling device.

U.S. Pat. No. 5,888,883 discloses a method of dividing a wafer and a method of manufacturing a semiconductor device to satisfy the demand of small-sizing and thinning.

According to this method, the groove, the depth of which is deeper than a thickness of a finished chip is formed on one surface of a wafer along dicing line. After the wafer is fixed on a table of a grinding device by a PSA tape, the other surface opposing to the PSA tape of the wafer is grinding to reach the grooves. Thereby, the wafer is easily divided into the individual chips.

However, these above-mentioned methods for manufacturing the semiconductor device have a problem that the exposed parts are often damaged by the handling device, since the diced face and the corners of the substrate are exposed.

Japanese Patent Application Laid-Open No. 10-79362 also discloses, as the twenty-first embodiment, a method for manufacturing a semiconductor device, which prevents a damage at the time of handling by forming a resin layer on the whole side faces of the diced substrate 116 so as to cover the exposed parts.

FIGS. 17A to 17D show the method for manufacturing the semiconductor device according to the twenty-first embodiment.

In the embodiment, as shown in FIGS. 17A to 17D, before the resin sealing process, a first dicing process is performed to dice the substrate 116 into semiconductor devices 112. Bumps 120 and electric circuits are formed on each of the semiconductor devices 112.

After completion of the first dicing process, the resin sealing process is performed. In the resin sealing process, as shown in FIG. 17A, the semiconductor devices 112 once diced are aligned and mounted on a film member 113 as a base material in a state where a gap 114 is formed between the neighboring semiconductor devices 112.

At this time, the semiconductor device 112 is adhered to the film member 113 by using an adhesive.

As described above, after the semiconductor devices 112 are mounted on the film member 113, a resin compression molding process is carried out, and the resin layer 130 is formed on the surface of the semiconductor devices 112. The resin layer 106 is formed in the gap 114.

Subsequently, a projected electrode exposing process of exposing at least the tip of each of the bumps 120 from the resin layer 130 is performed.

FIG. 17B shows a state where the processes are finished.

Subsequently, in a second dicing process, the slicing process is performed in a position between the neighboring semiconductor devices 112, that is, in the position where the resin layer 106 is formed. The resin layer 106 is sliced together with the film member 113 into, as shown in FIG. 17C, the semiconductor devices 112 on which the resin layer 130 is formed. Subsequently, as shown in FIG. 17D, the film member 113 is removed.

As described above, since the side faces and corners of the diced semiconductor devices 112 are covered with a resin, the resin parts can be held by the handling device. Consequently, the semiconductor device 112 can be prevented from being damaged.

The above-described method for manufacturing the semiconductor device has, however, the following problems.

Specifically, in the twenty first embodiment, the substrate is preliminarily sliced into semiconductor devices and the semiconductor devices are aligned at predetermined intervals and adhered to the film member. The work is therefore troublesome and the productivity is extremely low.

In order to serve the demand of a thinner semiconductor device in the market, it can be considered that a thinner IC wafer is used from the beginning. When the thinner IC wafer is processed by the above-described manufacturing method, however, the following problem occurs.

In the manufacturing process, for example, when a very small crack occurs at the time of grinding the IC wafer, the crack may progress during formation of bumps in the bump forming process. The progress of the crack causes many fractures in the wafer and severely deteriorates the manufacturing yield.

It is an object of the invention to provide a method for manufacturing a chip-scale package and an IC chip, which facilitate handling at the time of manufacturing a semiconductor device with satisfying the demands of small-sizing and thinning. It is an another object of the invention to provide a method for manufacturing a cheap chip-scale package and an IC chip with high productivity by preventing occurrence of fractures in a chip.

DISCLOSURE OF INVENTION

According to one aspect of the present invention, in order to achieve the object, there is provided a method for manufacturing a chip-scale package, comprising: a semiconductor device forming step of forming a plurality of pad in predetermined positions on an active face of the IC wafer; an electrode forming step of forming a projected electrode in a pad formed on an active face of an IC wafer; a groove forming step of forming a groove in the active face of the IC wafer along a line that the IC wafer is divided into individual pieces; a protective resin applying step of applying a protective resin on the active face of the IC wafer including the groove; an adhesive member applying step of applying an adhesive member on the active face on which the protective resin is applied; a grinding step of grinding an inactive face of the IC wafer which is fixed by the adhesive member until the groove is reached to the inactive face of the IC wafer; an adhesive member removing step of removing the adhesive member applied to the active face; and a separating step of applying an adhesive member to the ground face of the IC wafer, which has been ground in the grinding step, dicing the protective resin along the lines into chip-scale packages in a state where the IC wafer is fixed by the adhesive member and, after that, removing the adhesive member applied to the ground face.

According to another aspect of the present invention, in order to achieve the object, there is provided a method for manufacturing an IC chip, comprising: a semiconductor device forming step of forming a plurality of a pad in a predetermined position on an active face of an IC wafer; an electrode forming step of forming a solder layer on the pad, applying a flux on the active face of the IC wafer and the solder layer, rounding the solder layer applied with the flux by a reflow; a groove forming step of forming a groove on the active face of the IC wafer along a line that the IC wafer is divided into individual IC chips; an adhesive member applying step of applying an adhesive member on the active face; a grinding step of grinding an inactive face of the IC wafer which is fixed by the adhesive member until the groove is reached to the inactive face of the IC wafer; a connecting step of connecting the individual IC chips each other not to be separated by applying an adhesive member on the active face; an adhesive member removing step of removing the adhesive member from the active face; an IC wafer cleaning step of flushing the flux from the active face; and a picking up step of picking the IC chip up from the adhesive member which connects the IC chips each other.

According to another aspect of the present invention, in order to achieve the object, there is provided a method for manufacturing an IC chip, comprising: a semiconductor device forming step of forming a plurality of pads in predetermined positions on an active face of an IC wafer; an electrode forming step of forming a projected electrode on the pad; a protective layer forming step of applying a photoresist on the active face of the IC wafer and on a gold bump; and a groove forming step of forming a groove on the active face of the IC wafer along a line that the IC wafer is divided into individual pieces: an adhesive member applying step of applying an adhesive member on the active face on which the protective resin is applied; a grinding step of grinding an inactive face of the IC wafer which is fixed by the adhesive member until the groove is reached to the inactive face of the IC wafer; a connecting step of connecting the individual IC chips each other not to be separated by applying an adhesive member on the active face;

an adhesive member removing step of removing the adhesive member applied to the active face; a protective layer removing step of removing the protective layer; and a picking up step of picking the IC chip up from the adhesive member which connects the IC chips each other.

The projected electrode may be either a solder bump or a gold bump.

Preferably, the protective resin is applied so that the projected electrode is exposed in the protective resin applying step. The protective resin is applied so as to cover the projected electrode in the protective resin applying step. The projected electrode may be exposed after an adhesive member is applied to the ground face of the IC wafer. In this case, the protective resin surface may be subjected to an ashing process to expose the projected electrode.

In the groove forming step of forming a groove in the IC wafer, an adhesive member is applied to an inactive face in advance and, after that, the adhesive member may be removed.

The sequence of each process can be replaced. For example, the groove forming process can be provided before the protective layer forming process. An adhesive member applied to the active face can be removed, after applying an adhesive member to the ground face of the IC wafer.

BRIEF DESCRIPTION OF THE DRAWINGS

FIGS. 17A to 17D are diagrams showing a method for manufacturing a semiconductor device disclosed as a twenty first embodiment in Japanese Patent Application Laid-Open No. 10-79362.

BEST MODE FOR CARRYING OUT THE INVENTION

A method for manufacturing a chip-scale package of the invention will be described with reference to the drawings.

FIGS. 1A to 1E are diagrams for explaining processes of the method for manufacturing a chip-scale package according to an embodiment of the invention. FIGS. 2 to 12 are diagrams for more specifically explaining the processes of the manufacturing method for the invention.

Figure 1:
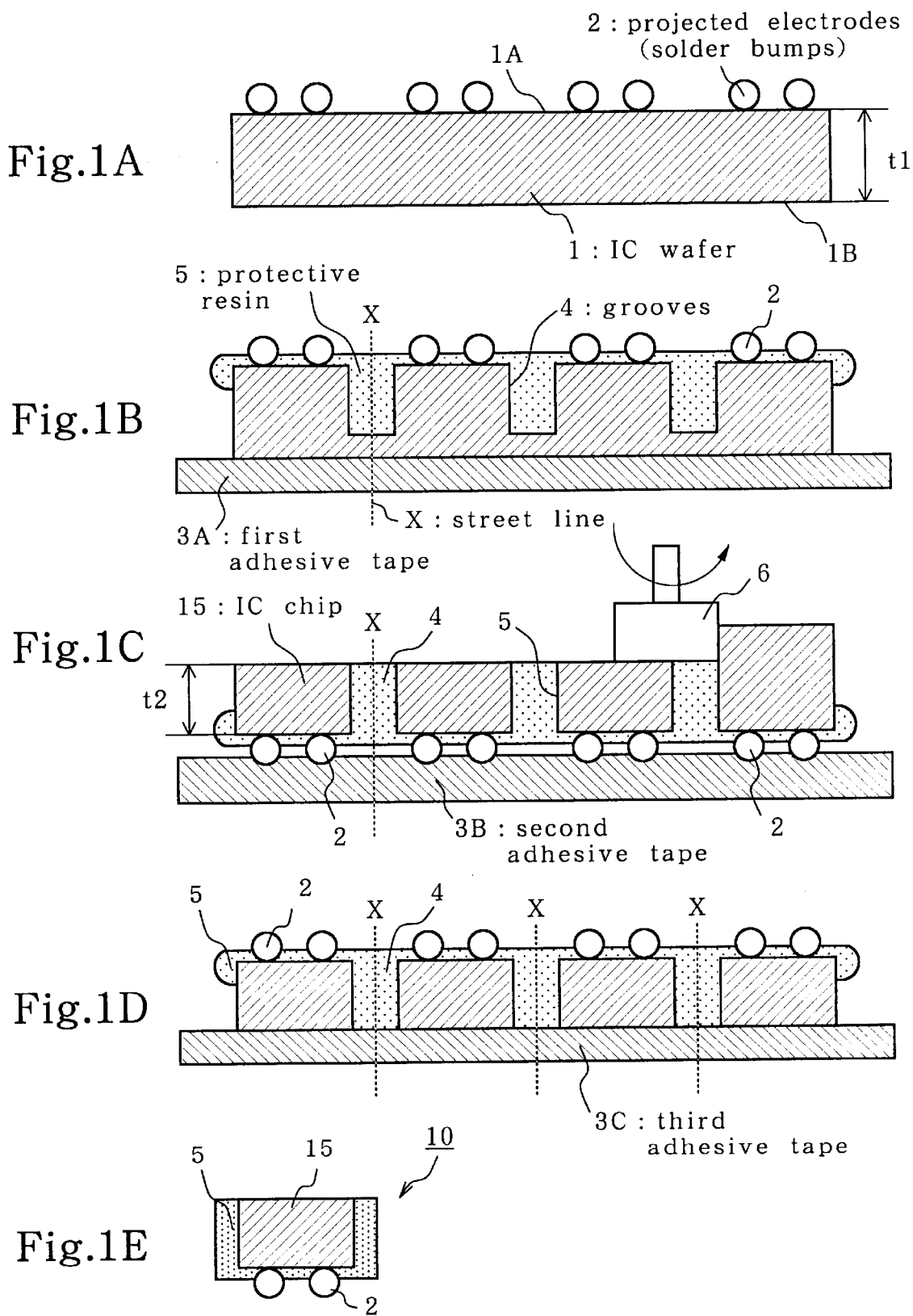
FIGS. 1A to 1E are diagrams for explaining processes of a method for manufacturing a chip-scale package according to an embodiment of the invention.

FIG. 1A shows state where the semiconductor device forming process and the projected electrode forming process are finished.

For example, a known circuit formation is performed on an IC wafer 1 having a thickness t1 of about 625 μm. Projected electrodes (solder bumps) 2 are formed on a plurality of pad electrodes formed in predetermined positions in an active face 1A of the IC wafer 1, thereby forming bumps.

FIG. 1B shows a state where a first tape adhering process, a groove forming process and a protective resin applying process are finished.

In the first tape adhering process, a first adhesive tape 3A as an adhering member is adhered to an inactive face 1B of the IC wafer 1. Grooves 4 which are orthogonal to the IC wafer 1 are formed in the active face 1A side along lines X. The first adhesive tape 3A is obtained by forming an adhering face as one of the faces of a supporting member as a base material. The adhering face is adhered to the inactive face 1B. As the first adhesive tape 3A, it is preferable to use a tape having the adhering face whose adhesion properties can be easily weakened by irradiation of ultraviolet rays or the like (e.g. SUMILITE FSL-N4003 made by Sumitomo Bakelite Co., Ltd.).

When the grooves 4 are formed, the other face of the supporting member of the first adhesive tape 3A is attached to a table of a groove forming apparatus (not shown) by vacuum attraction or the like, thereby fixing the IC wafer 1 to the table.

Subsequently, a protective resin 5 is applied on the active face 1A including the grooves 4 so as to expose the solder bumps 2 out of the protective resin 5.

FIG. 1C shows a state where a first tape removing process, a second tape adhering process and a grinding process are finished.

In the first tape removing process, the first adhering tape 3A adhered to the inactive face 1B is removed. In the second tape adhering process, after the first tape removing process, a second adhesive tape 3B as an adhering member is adhered to the active face 1A on which the protective resin 5 is applied. The second adhesive tape 3B (e.g. ELEP HOLDER NBD-2170K made by NITTO DENKO CORPORATION) has an adhering face similar to the first adhesive tape 3A on one of the faces. The adhering face is adhered to the active face 1A. The other face is attached to a table of a grinding apparatus (not shown) by vacuum attraction or the like.

In the grinding process, the inactive face 1B is ground with a grinding stone 6 to expose the protective resin 5 in the grooves 4 from the inactive face 1B of the IC wafer 1. At this time, a thickness t2 of an IC chip 15 is, for example, about 100 μm.

FIG. 1D shows a state where a second tape removing process, a third tape adhering process and a dicing process are finished.

In the second tape removing process, the second adhesive tape 3B adhered to the active face 1A is removed. In the third tape adhering process, after the second tape removing process, a third adhesive tape 3C as an adhesive member is applied to the ground inactive face 1B (ground face). As the third adhesive tape 3C, the same one as the first adhesive tape 3A can be used. One of the faces is the adhesive face which is adhered to the inactive face 1B. The other face is attached to a table of a dicer (not shown) by vacuum attraction or the like.

Figure 16A:
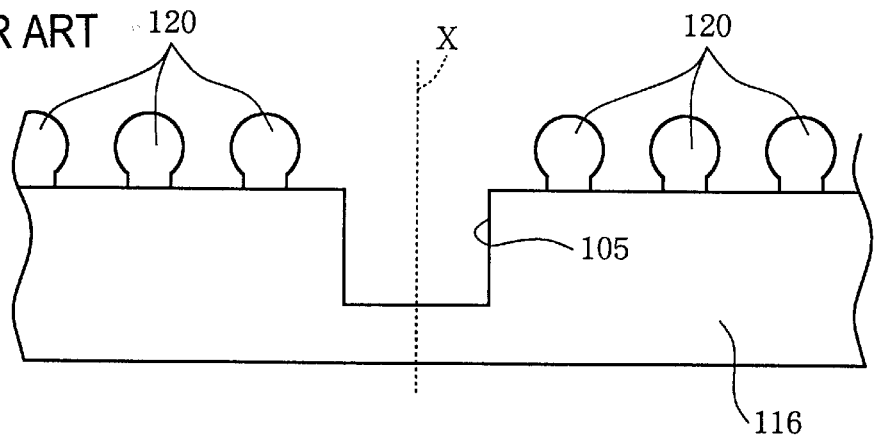
FIGS. 16A to 16C are diagrams showing a method for manufacturing a semiconductor device disclosed as a nineteenth embodiment in Japanese Patent Application Laid-Open No. 10-793652.
Figure 16B:
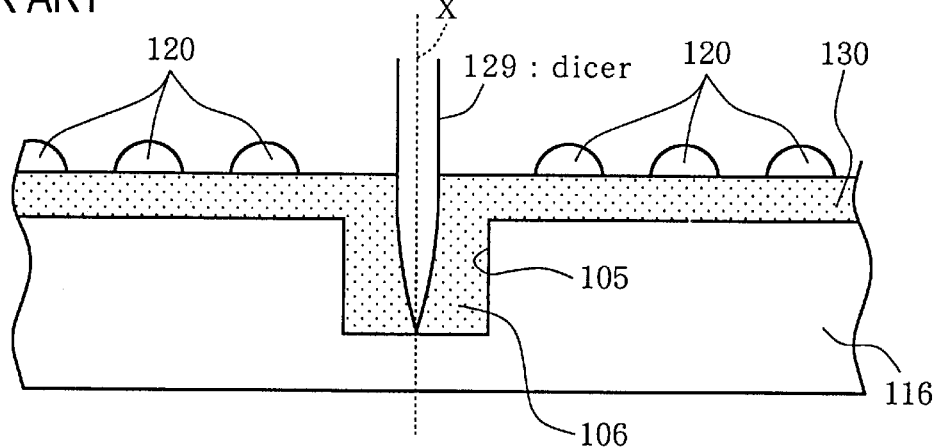
Figure 16C:
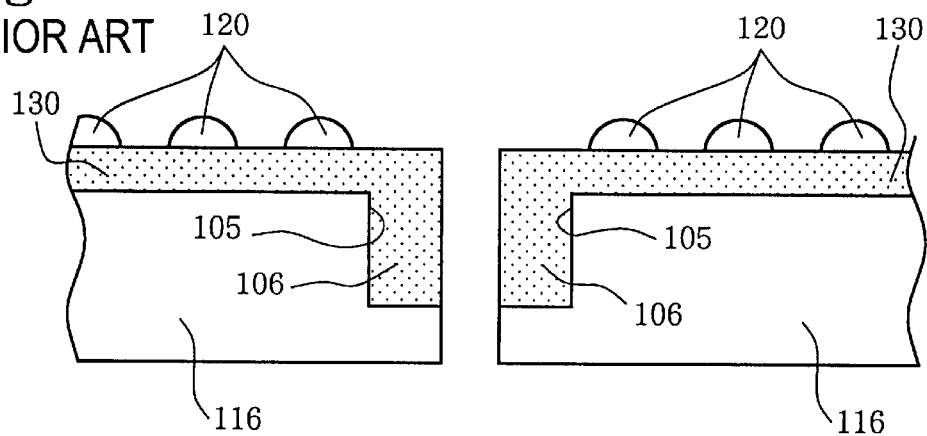

In the dicing process, the protective resin 5 is diced from the active face 1A side along the lines X into the IC chips 15 by the dicer 129 (refer to FIG. 16).

FIG. 1E is a cross section of the chip-scale package obtained when the third tape removing process is finished.

In the third tape removing process, the third adhesive tape 3C adhered to the inactive face 1B of the IC chip 1 is removed. By the process, the chip-scale package 10 is completed. The chip-scale package 10 completed in such a manner is a very thin package whose active face and all the side faces are protected by the protective resin 5 and in which the solder bumps 2 are exposed from the protective resin 5.

Referring now to FIGS. 2 to 12, the method for manufacturing the chip-scale package of the invention will be described more specifically.

Figure 2:
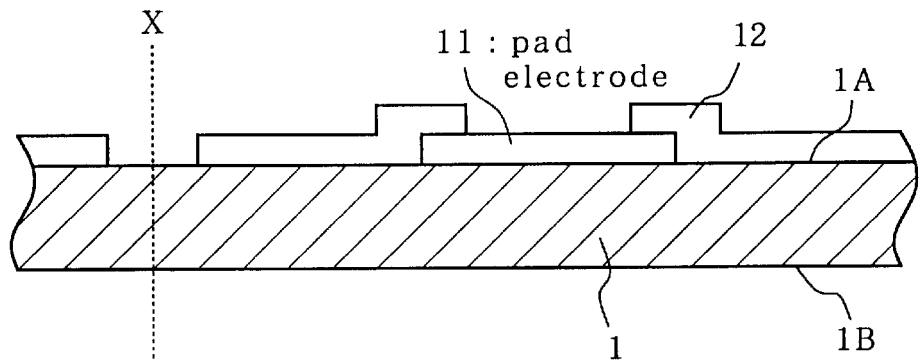
FIG. 2 is a diagram showing a semiconductor device forming process of forming a pad electrode on an IC wafer.

FIG. 2 shows a semiconductor device forming process for forming a pad electrode 11 on the IC wafer 1.

As shown in FIG. 2, for example, the pad electrode 11 mad e of Al (aluminum) or the like is formed in a predetermined position in the active face 1A of the IC wafer 1. On the active face 1A, further, a passivation film 12 is formed. Reference character X denotes a line (a street) as a reference of slicing and dicing the wafer into individual IC chips in a post process.

Figure 3:
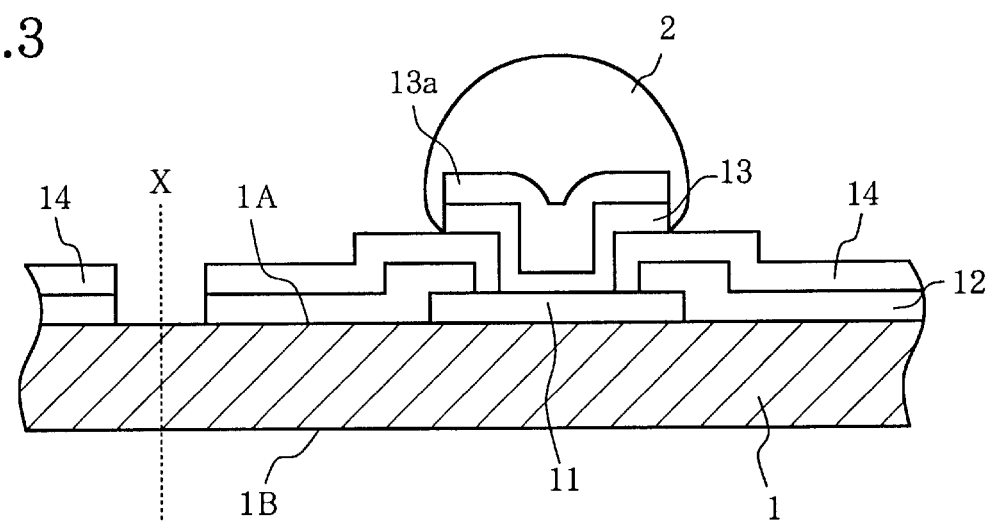
FIG. 3 is a diagram showing a solder bump forming process.

FIG. 3 shows a solder bump forming process.

In the process, in order to protect the PV film and lessen the stress on the bumps, polyimide 14 is applied on the pad electrode 11 and the passivation film 12. Portions in which the bumps 2 are formed and the portion of the line X are opened.

On the Al layer of the pad electrode 11, an under bump metal 13 consisting of three layers of Cu, Cr and Al is formed by sputtering. By forming the Al layer as the bottom layer of the under bump metal 13, the adhesion between the pad electrode 11 as the Al layer and the under bump metal 13 can be enhanced. The Cr layer as the intermediate layer prevents diffusion of Cu to Al. The Cu layer as the top layer has excellent adhesion with Cr, also has excellent adhesion with solder, and has high solderability. Reference numeral 13A denotes a Cu plating layer. The solder of the bumps 2 is eutectic solder having a proportion of tin and lead of about 6:4. In place of the solder bumps 2 as projected electrodes, gold bumps having a low resistance value may be also used.

Figure 4:
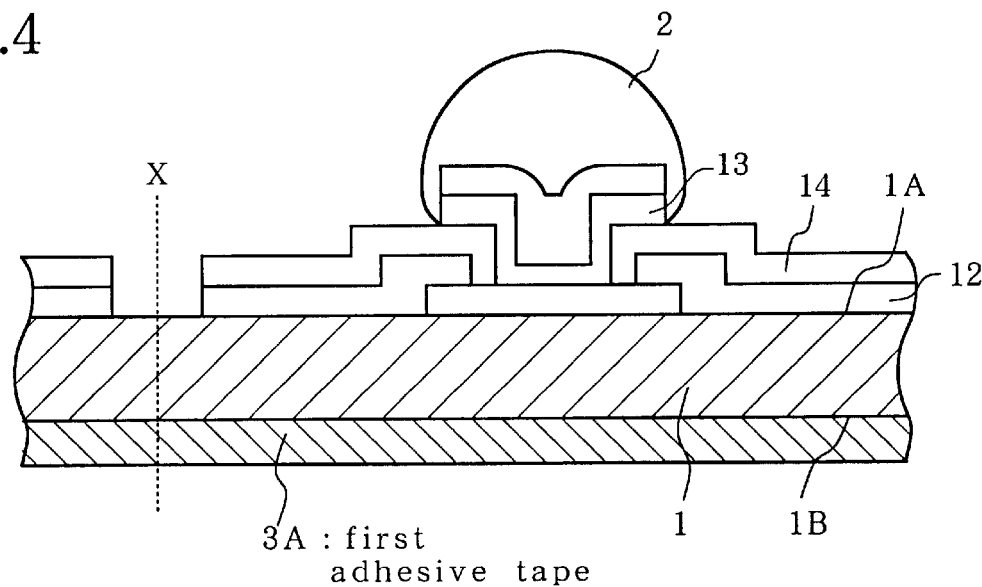
FIG. 4 is a diagram showing a first tape adhering process.

FIG. 4 shows a first tape adhering process.

In the process, the first adhesive tape 3A is adhered to the inactive face 1B of the IC wafer 1.

Figure 5:
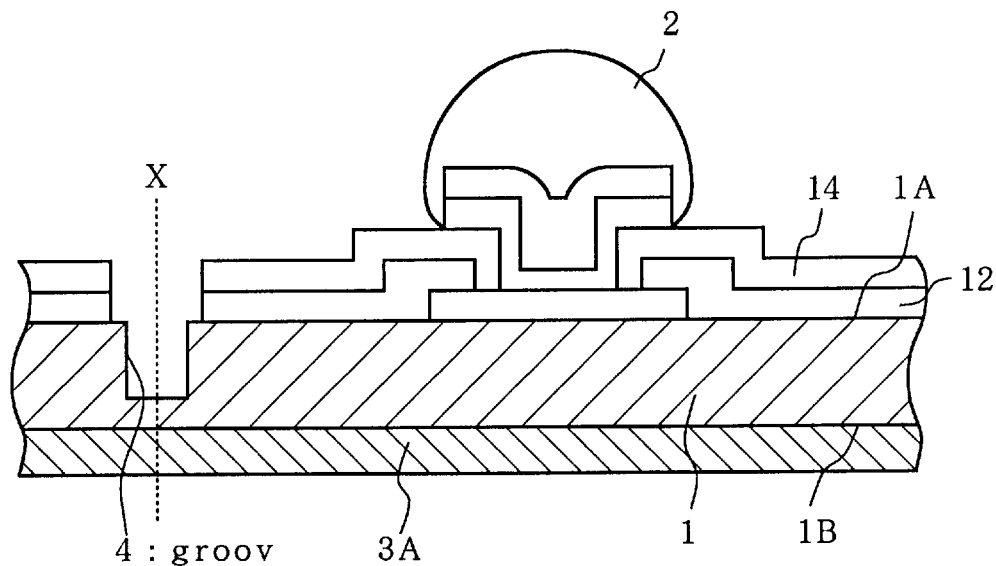
FIG. 5 is a diagram showing a groove forming process.

FIG. 5 shows a groove forming process.

In the process, the other face of the first adhesive tape 3A is attached to a table of a groove forming apparatus (not shown) by vacuum attraction or the like to fix the IC wafer 1 to the table. The groove 4 is formed on the active face 1A side of the IC wafer 1 on which the solder bumps 2 are formed along the line X for dicing the IC wafer 1 into individual chips. The groove 4 is formed so as to be wider than that of a dicer for dicing the IC wafer 1 into chips, which will be described hereinlater. Further, the width of the groove 4 is set so that the protective resin 5 remains on the side faces of each of the IC chips 15. The depth of the groove 4 is set so as to be slightly deeper than the depth required by the completed IC chip 15.

Figure 6:
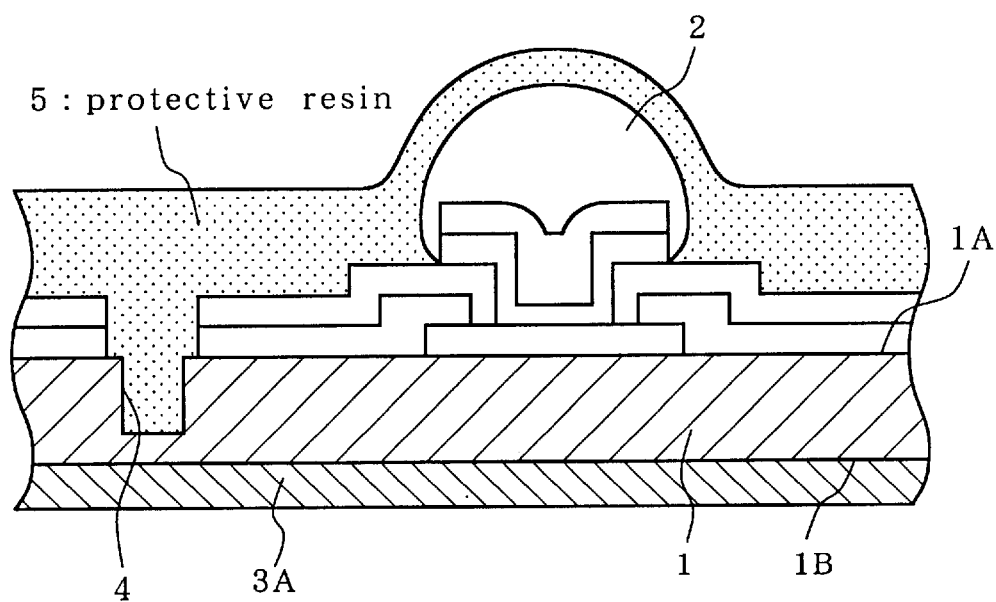
FIG. 6 is a diagram showing a protective resin applying process.

FIG. 6 shows a protective resin applying process.

In the process, the protective resin 5 is applied so as to cover the active face 1A including the groove 4 formed in the IC wafer 1 and the solder bumps 2 by spin coating. Obviously, the protective resin 5 may be applied so that the solder bumps 2 are exposed from the beginning. Preferably, the protective resin 5 is a thermosetting resin such as polyimide, epoxy resin, or the like.

Since the groove 4 is as narrow as about 70 $\mu$m, a resin of low viscosity is applied first. By the application, the groove 4 is almost substantially filled with the the resin. Subsequently, a resin of high viscosity is applied relatively thick. It is preferable to form a relatively thick resin layer by applying the high viscosity resin for a number of times. It is also possible to perform transfer molding by using a die.

The protective resin 5 is applied for the following purposes;
1) to prevent a chip from being destroyed by an external force,
2) to protect the IC from contamination, and
3) to assure the reliability of an IC by preventing invasion of ions and the like.

A resin coat adapted to the purposes is therefore needed.

Figure 7:
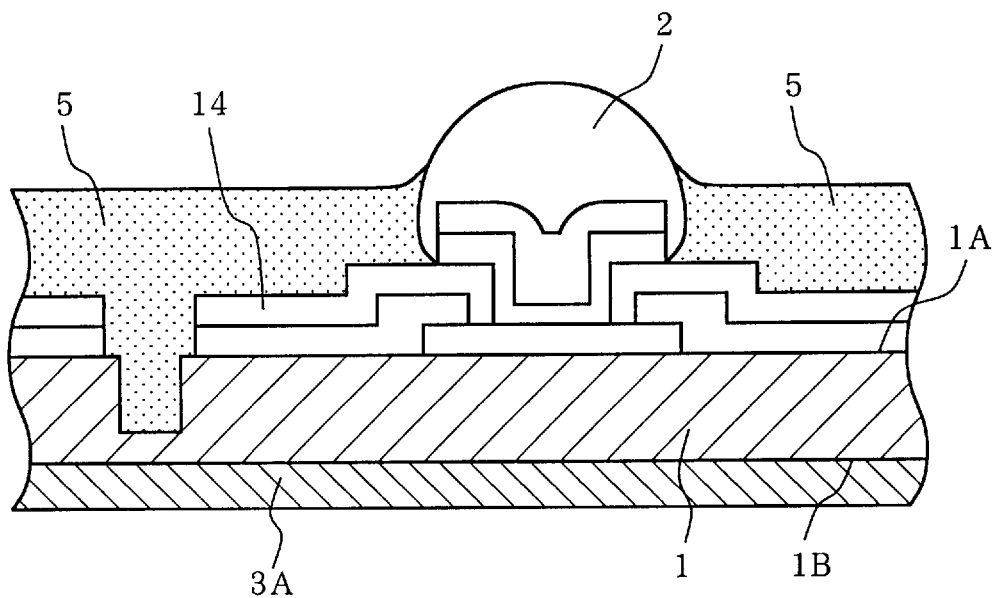
FIG. 7 is a diagram showing an ashing process.

FIG. 7 shows an ashing process.

In the process, the protective resin 5 covering the bumps 2 is irradiated with plasma to make the protective resin 5 decomposed and evaporated from the surface. By the ashing, the tip of each of the bumps 2 is exposed from the protective resin 5.

Figure 8:
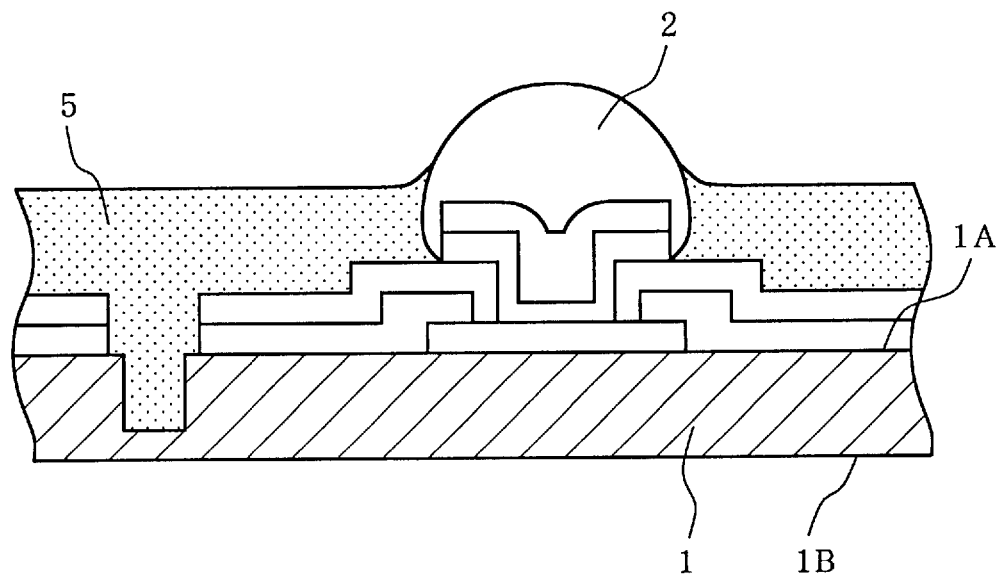
FIG. 8 is a diagram showing a process of striping off a first adhesive tape.

FIG. 8 shows a process of removing the first adhesive tape 3A.

In the process, the first adhesive tape 3A adhered to the inactive face 1B of the IC wafer 1 is irradiated with ultraviolet rays, thereby removing the first adhesive tape 3A from the IC wafer 1.

Figure 9:
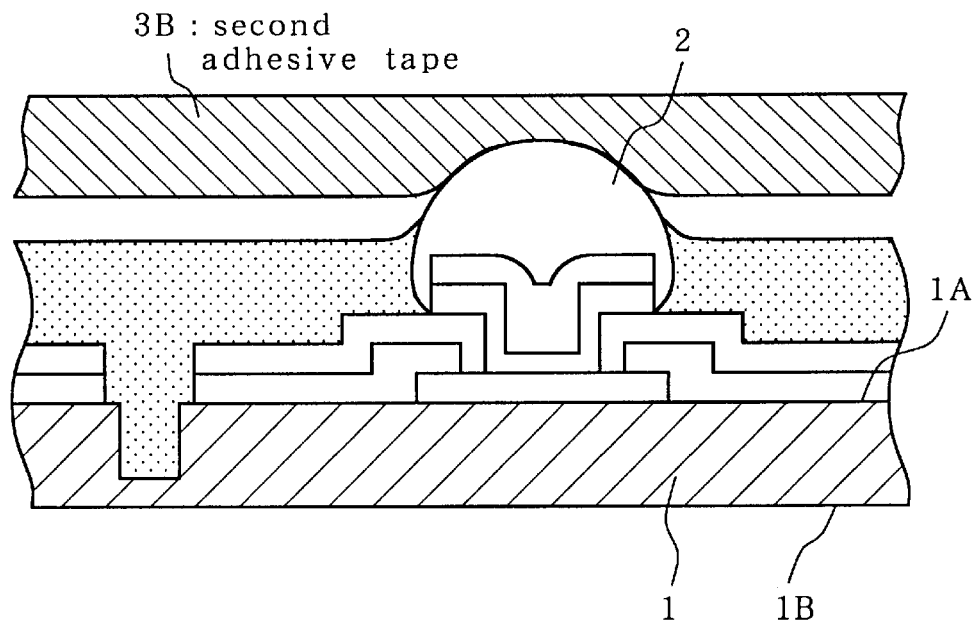
FIG. 9 is a diagram showing a second tape adhering process.

FIG. 9 shows a second adhesive tape adhering process.

In the process, the second adhesive tape 3B is adhered to the tips of the solder bumps 2 formed on the active face 1A side of the IC wafer 1.

Figure 10:
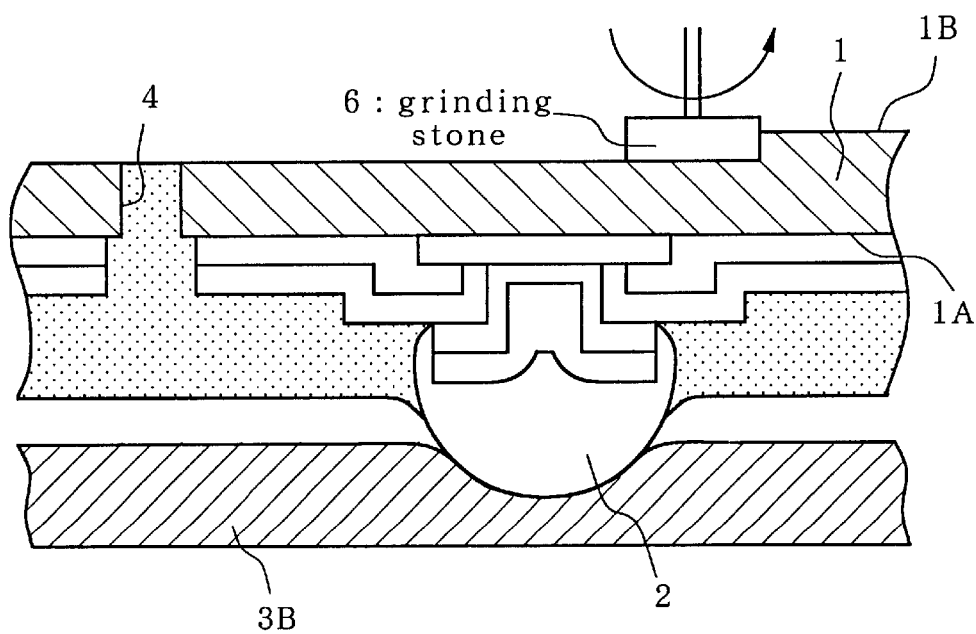
FIG. 10 is a diagram showing a grinding process.

FIG. 10 shows a grinding process.

In the process, the other face (face opposite to the face of the solder bumps 2) of the second adhesive tape 3B is attached to a table of a grinding apparatus (not shown) by vacuum attraction or the like. The inactive face 1B of the IC wafer 1 is ground with the grinding stone 6 of the gliding apparatus until the bottom of the groove 4 is removed and the protective resin 5 is exposed. The grinding amount is equal to a thickness t2 of the IC chip 15 of, for example, t2=100 $\mu$m. Although the IC wafer 1 is formed into the individual IC chips 15 in the grinding process, the chips 15 are still integrated by the protective resin 5.

The IC chip 15 is electrically insulated in such a state. Consequently, by conducting an electric test on all of the IC chips 15, a check or burn-in can be performed.

Figure 11:
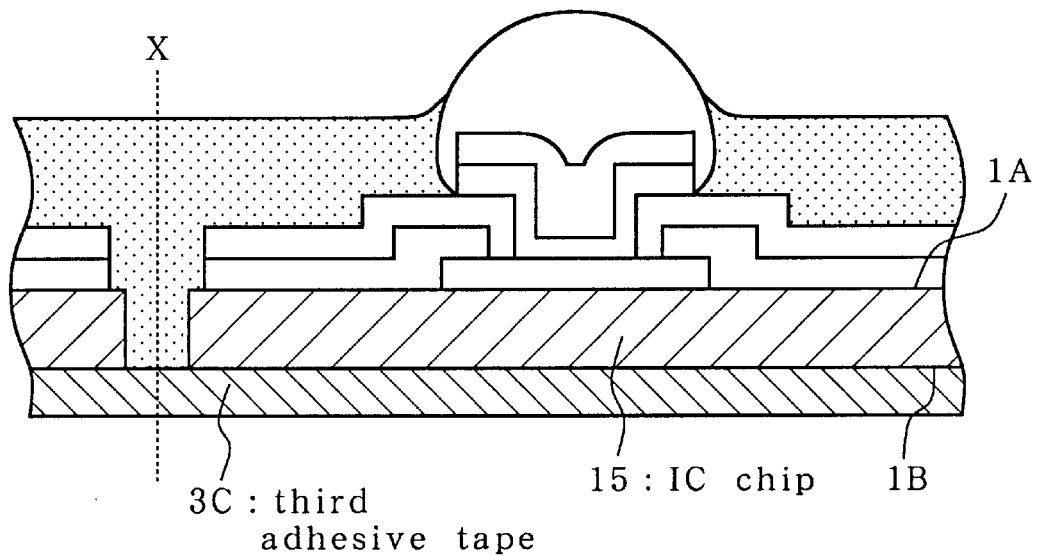
FIG. 11 is a diagram showing a third tape adhering process and a dicing process.

FIG. 11 shows a third tape adhering process and a dicing process.

In the third tape adhering process, after grinding the IC wafer 1, the third adhesive tape 3C is applied to the ground inactive face 1B. The second adhesive tape 3B is removed before the third adhesive tape 3C is applied to the ground inactive face 1B. The second adhesive tape 3B can be removed, after the third adhesive tape 3C is applied.

In the dicing process, the third adhesive tape 3C is attached to a dicing table of a not-illustrated dicer (e.g. DICING RING MODTF26-1 made by DISCO CORPORATION) by vacuum attraction or the like to fix the IC wafer 1. The protective resin 5 connecting the IC chips 15 is diced into the individual IC chips 15 along the line X (Y direction is not shown) by using the dicer (not shown).

Figure 12:
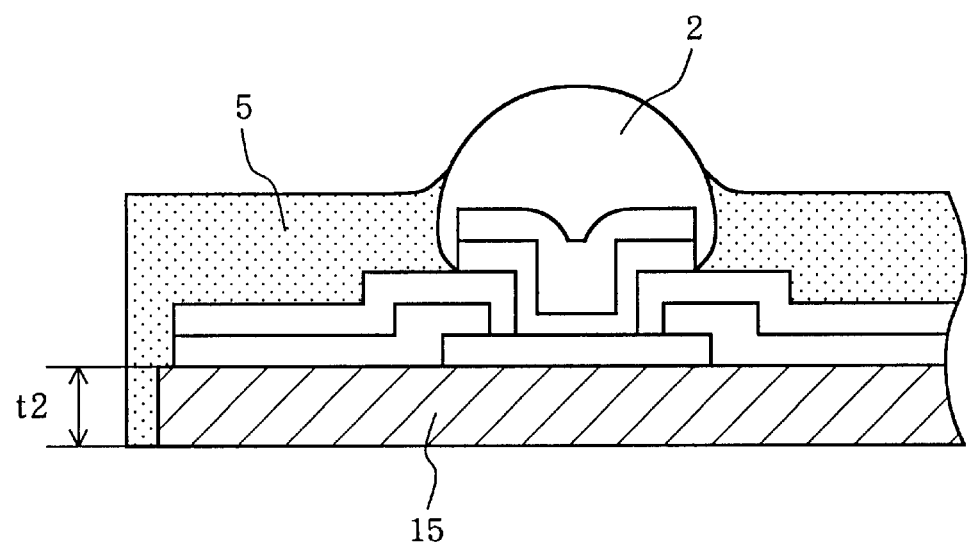
FIG. 12 is a diagram showing a third tape removing process.

FIG. 12 shows ea third tape removing process.

In the process, the third adhesive tape 3C adhered to the back face (inactive face 1B) of the IC chip 15 is irradiated with ultraviolet rays and is removed. In such a manner, the very thin chip-scale package 10 is completed. In the completed chip-scale package 10, the solder bumps 2 are exposed and the active face 1A and all the side faces are protected by the protective resin 5.

According to this embodiment, the IC wafer is ground to a desired thickness before the IC wafer is divided into individual IC chips and the protective resin having flexibility is diced, a stress applied as an external force is absorbed by the protective resin, and the occurrence of a crack in the IC wafer can be prevented. By forming the protective resin on the side faces of the IC wafer, the easy handling can be obtained and the damages such as a chipping off the wafer can be prevented.

In this embodiment, the ashing process is performed so as to expose the projected electrodes immediately after application of the protective resin in the foregoing embodiment of the invention, but the invention is not limited to the manner. The sequence of each process can be replaced. For example, it is possible to perform the ashing process to expose the projected electrodes after the grinding process is finished and the third adhesive tape is adhered to the ground face of the IC wafer.

An another embodiment of the present invention will be explained referring to FIG. 13 to FIG. 15. FIG. 13 to FIG. 15 which are diagrams for explaining processes of a method for manufacturing an IC chip according to an another embodiment of the invention. The IC chip can be used for manufacturing a chip-scale package. The same reference numerals are applied to the same parts and the same materials as the above-mentioned embodiment, and a detailed explaining for them are omitted.

Figure 13A:
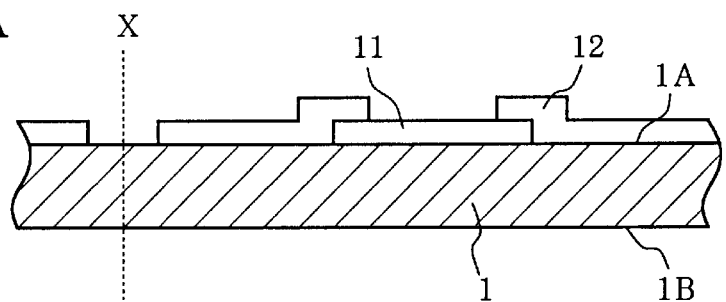
FIGS. 13A to 13D are diagrams according to an another embodiment of the invention for explaining processes from a semiconductor device forming process to a solder bump forming process.

FIG. 13A shows a semiconductor device forming process, where a plurality of pad electrodes 11 is formed on an IC wafer 1.

Figure 13B:
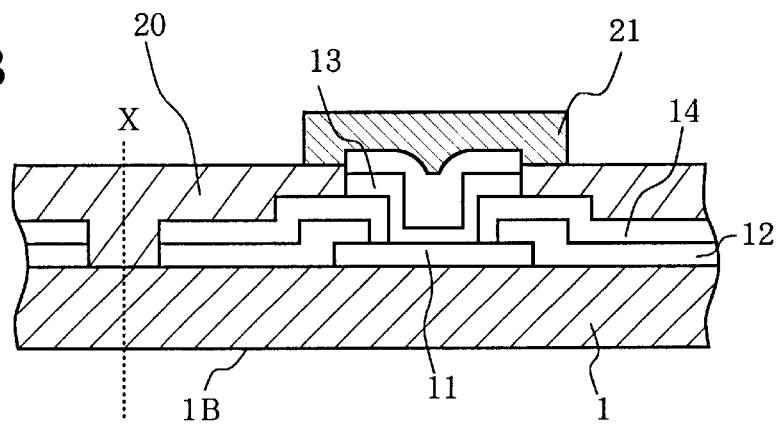

FIG. 13B shows a solder layer forming process, where a solder layer 21 is formed on the pad electrode. In this process, a plating resist layer 20 is formed on the active face 1A of the IC wafer 1. And, the solder layer 21 is formed on the portion of the pad electrode 2 of the IC wafer 1 by using the plating bump method.

Figure 13C:
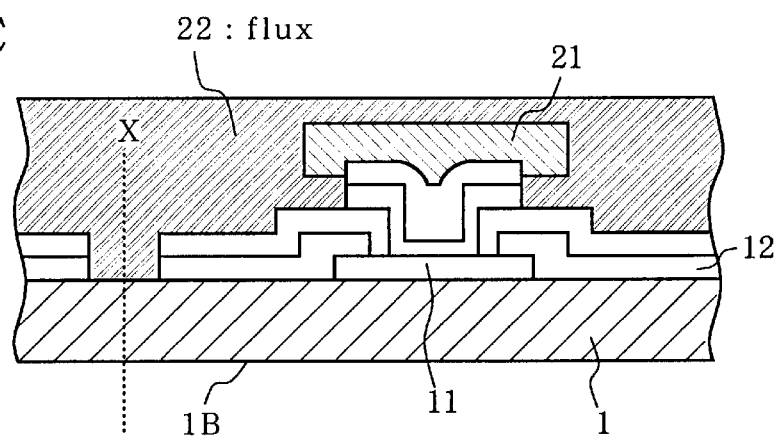

FIG. 13C shows a process where a flux 22 is applied on the active face 1A of the IC wafer 1 and the solder layer 21.

Figure 13D:
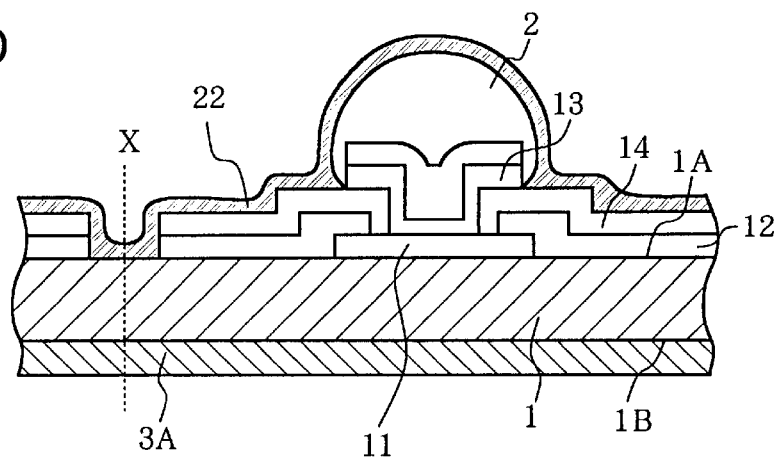

FIG. 13D shows a process where the solder bump 2 is formed on the pad electrode 2 by reflowing the solder layer 21 at a predetermined temperature to round it. In this process, the first adhesive tape 3A can be affixed to inactive face 1B of the IC wafer 1. In the grinding process described later, the flux 22 applied to form the solder bump 2 has a function as a protective layer which prevents from touching grits, chips and the like to the active face 1A.

Figure 14A:
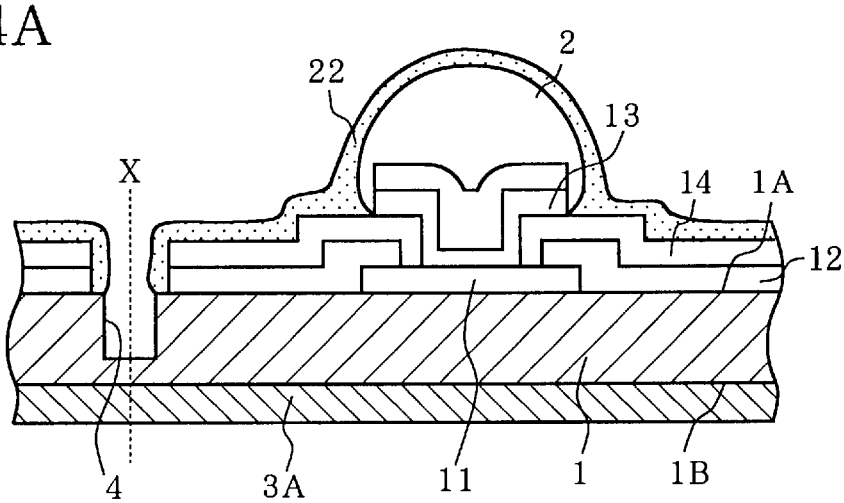
FIGS. 14A to 14C are diagrams according to an another embodiment of the invention for explaining processes from a groove forming process to a grinding process.

FIG. 14A shows the process where the grooves 4 are formed along the line X. This process is the same as the above-mentioned groove forming process described in FIG. 5.

Figure 14B:
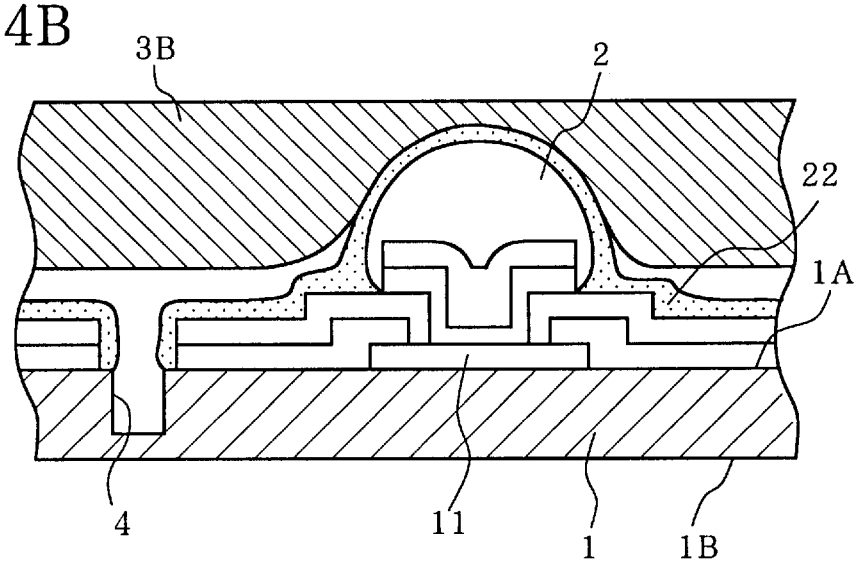

FIG. 14B shows the process where the first adhesive tape 3A is removed from the inactive face 1B, and the process where the second adhesive tape is attached to the active face 1A where the flux 22 is applied.

Figure 14C:
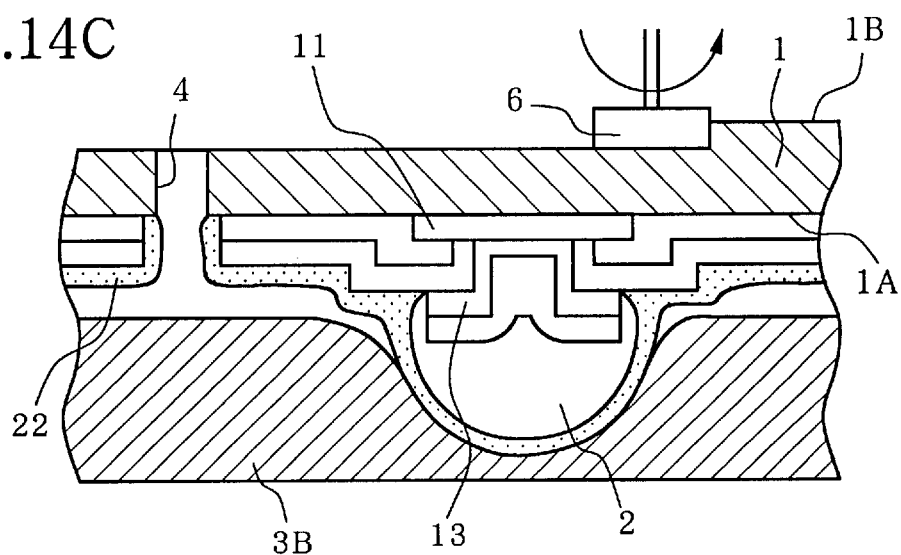

FIG. 14C shows the grinding process. In this process, inactive face 1A is ground with a grinding stone 6 until the groove 4 is reached to the inactive face 1A of the IC wafer 1.

Above-mentioned processes set forth in FIGS. 13A–13D, FIG. 14B and FIG. 14C are disclosed in Japanese Patent Application Laid-Open No.2000-31185.

Figure 15A:
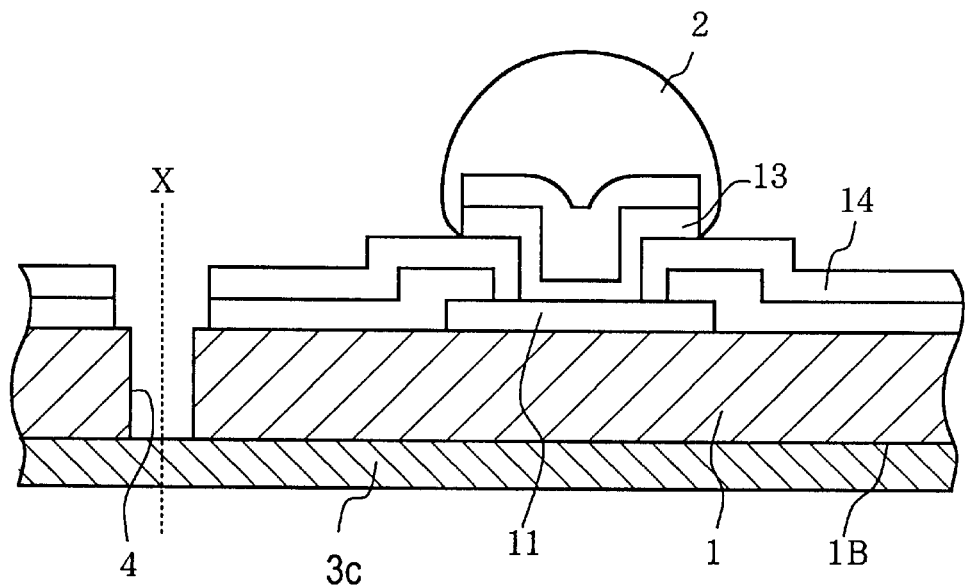
FIGS. 15A and 15B are diagrams according to another embodiment of the invention for explaining processes from a flux washing dawn process to an IC chip picking up process.

FIG. 15A shows the processes where the third adhesive tape 3C is attached to the inactive face 1B, before the second adhesive tape 3B is removed from the active face 1A, and then the flux 22 is flushed from the active face 1A. With the third adhesive tape 3C, the individual IC chips 15 are connected each other not to be separated.

Figure 15B:
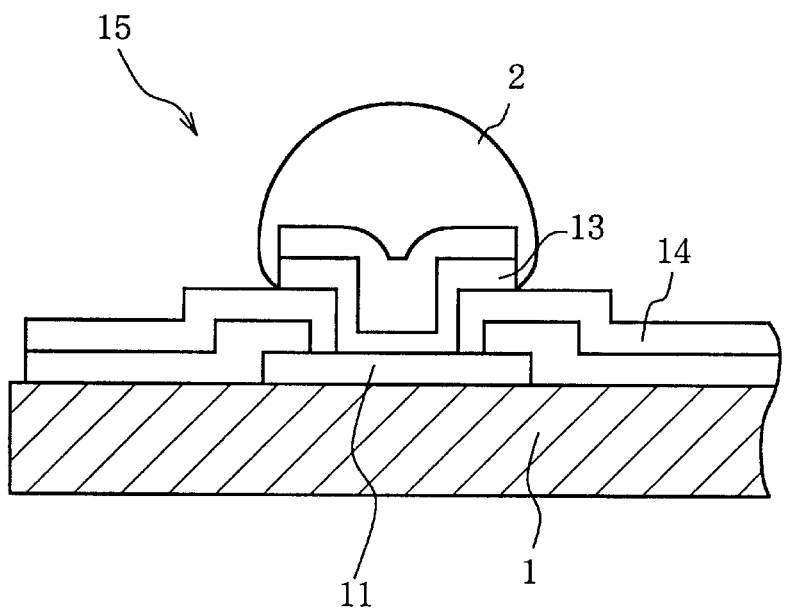

FIG. 15B shows the individual IC chip 15 picked up from the third adhesive tape 3C.

In the above-mentioned manufacturing method, the flux 22 which is applied on the solder layer 21 to form the solder bump 2 acts as a protective layer to protect the active face 1A. Instead of the protective layer of the flux 22, a photoresist can be used for forming the protective layer. In this case, before the protective layer of the photoresist is formed, the flux 22 is flushed from the active face 1A by cleaning the IC wafer 1. And, the protective layer of the photoresist can be removed after the grinding process.

In the above-mentioned embodiments, a gold bump can be formed on the pad of the IC wafer instead of the solder bump. In this case, a photoresist can be used instead of using the flux 22. After the gold bump is formed, the photoresist is applied on the active face of the IC wafer and on the gold bump as a protective layer. By using the gold bump, the rounding solder layer process for forming the bump can be excluded. After the protective layer is formed, the groove is formed in the above-mentioned grinding process. Then, after the grinding process, the photoresist is removed.

In the above-mentioned embodiments, the groove forming process can be provided after the protective layer forming process, and can be provided before the protective layer forming process.

As described above, the chip-scale package and the IC chip according to the invention can satisfy the demand of a thinner semiconductor device in the market. Specifically, since the bump forming process is performed in a state where the IC wafer is relatively thick, occurrence of a crack in the IC wafer can be prevented.

Unlike the conventional technique, the troublesome works of preliminarily dicing the IC wafer into individual IC chips and adhering the IC chips at predetermined intervals to the film member are not necessary. Consequently, a number of IC chips can be manufactured.

The invention is not limited to the adhesive member but any adhesive member can be used as long as the adhesive member is easily applied to the IC wafer, has sufficient adhesion to fix the IC wafer and is easily removed from the IC wafer. For example, a resin plate, a rubber plate, or the like each having an adhesive face may be used.

Further, both faces of the adhesive member may be adhering faces. One of the adhering faces may be applied to the IC wafer and the other adhering face may be attached to the table of the groove forming apparatus or the like to fix the IC wafer.

According to this invention, after forming the projected electrodes, the back grinding is performed, thereby reducing the thickness of the IC wafer. A semiconductor device of a desired thickness can be manufactured with a high yield.

Since the active face and all the side faces of the semiconductor device are covered with the protective resin, the handling device can be used without damaging the semiconductor device, thereby improving the productivity. Thus, the manufacturing processes can be simplified and the method for manufacturing the cheap chip-scale package with high productivity can be provided.

Industrial Applicability

A chip-scale package and an IC chip manufactured according to the manufacturing method for the invention can be applied to not only a single-unit video camera-recorder and a portable telephone but also every electron device such as a television and a personal computer.

What is claimed is:

1. A method for manufacturing a chip-scale package, comprising:
a semiconductor device forming step of forming a plurality of pads in predetermined positions on an active face of an IC wafer;
an electrode forming step of forming a projected electrodes on the pads;
a groove forming step of forming a groove on the active face of the IC wafer along a line that the IC wafer is divided into individual pieces;
a protective resin applying step of applying a protective resin on the active face of the IC wafer including the groove;
an adhesive member applying step of applying an adhesive member on the active face on which the protective resin is applied;
a grinding step of grinding an inactive face of the IC wafer which is fixed by the adhesive member until the protective resin in the groove appears at the inactive face of the IC wafer;
an adhesive member removing step of removing the adhesive member applied to the active face; and
a separating and forming step of applying an adhesive member to a ground face of the IC wafer, which has been ground in the grinding step, dicing the protective resin along the line into chip-scale packages in a state where the IC wafer is fixed by the adhesive member and, after that, removing the adhesive member applied to the ground face.

2. A method for manufacturing a chip-scale package according to claim 1, wherein the projected electrode is a solder bump or a gold bump.

3. A method for manufacturing a chip-scale package according to claim 1, wherein the protective resin is applied so that the projected electrode is exposed in the protective resin applying step.

4. A method for manufacturing a chip-scale package according to claim 1, wherein the protective resin is applied so as to cover the projected electrode in the protective resin applying step, and exposing the projected electrode after grinding the inactive face.

5. A method for manufacturing a chip-scale package according to claim 4, wherein the protective resin is applied so as to cover the projected electrode in the protective resin applying step, and applying the adhesive member on the ground face of the IC wafer exposing the projected electrode.

6. A method for manufacturing a chip-scale package according to claim 4, wherein the protective resin surface is subjected to an ashing process to expose the projected electrode.

7. A method for manufacturing a chip-scale package according to claim 1, wherein an adhesive member is applied to the inactive face in advance in the groove forming step of forming the groove in the IC wafer, the groove is formed in a state where the IC wafer is fixed by the adhesive member and, after that, the adhesive member is removed.

8. A method for manufacturing an IC chip, comprising:
- a semiconductor device forming step of forming a plurality of pads in predetermined positions on an active face of an IC wafer;
- an electrode forming step of forming a solder layer on the pads, applying a flux on the active face of the IC wafer and the solder layer, and rounding the solder layer applied with the flux by a reflow;
- an adhesive member forming step of forming an adhesive member to an inactive face of the IC wafer;
- a groove forming step of forming a groove on the active face of the IC wafer along a line that the IC wafer is divided into individual IC chips in a state that the IC wafer is fixed by the adhesive member, which is then removed;
- an adhesive member applying step of applying an adhesive member on the active face;
- a grinding step of grinding the inactive face of the IC wafer which is fixed by the adhesive member until the groove appears at the inactive face of the IC wafer;
- a connecting step of connecting the individual IC chips each other by applying an adhesive member on the inactive face;
- an adhesive member removing step of removing the adhesive member from the active face;
- an IC wafer cleaning step of flushing the flux from the active face; and
- a picking up step of picking the IC chip up from the adhesive member which connects the IC chips each other.

9. A method for manufacturing an IC chip according to claim 2, wherein an IC wafer cleaning step and a protective layer forming step of forming a protective layer on the active face and the electrode are provided between the electrode forming step and the groove forming step, and a protection layer removing step of removing the protection layer is provided after the adhesive member removing step.

10. A method for manufacturing an IC chip, comprising:
- a semiconductor device forming step of forming a plurality of pads in predetermined positions on an active face of an IC wafer;
- an electrode forming step of forming projected electrodes on the pads;
- a protective layer forming step of applying the photoresist on the active face of the IC wafer and on the projected electrodes;
- an adhesive member applying step of applying an adhesive member on an inactive face of the IC wafer;
- a groove forming step of forming a groove on the active face of the IC wafer along a line that the IC wafer is divided into individual pieces in a state that the IC wafer is fixed by the adhesive member, which is then removed;
- an adhesive member applying step of applying an adhesive member on the active face on which the protective layer is applied;
- a grinding step of grinding the inactive face of the IC wafer which is fixed by the adhesive member until the groove appears at the inactive face of the IC wafer;
- a connecting step of connecting individual IC chips each other by applying an adhesive member on the inactive face;
- an adhesive member removing step of removing the adhesive member applied to the active face;
- a protective layer removing step of removing the protective layer; and
- a picking up step of picking the IC chip up from the adhesive member which connects the IC chips each other.

11. A method for manufacturing an IC chip according to claim 10, wherein the projected electrode is a solder bump or a gold bump.

12. A method for manufacturing an IC chip according to claim 9, wherein the protective layer is a photoresist.

13. A method for manufacturing an IC chip according to claim 10, wherein the protective layer is a photoresist.

14. A method for manufacturing a chip-scale package, comprising:
- a semiconductor device forming step of forming a plurality of pads in predetermined positions on an active face of an IC wafer;
  - an electrode forming step of forming projected electrodes on the pads;
  - a groove forming step of forming a groove on the active face of the IC wafer along a line that the IC wafer is divided into individual pieces;
  - a protective resin applying step of applying a protective resin on the active face of the IC wafer including the groove;
  - an adhesive member applying step of applying an adhesive member on the active face on which the protective resin is applied;
  - a grinding step of grinding an inactive face of the IC wafer which is fixed by the adhesive member until the protective resin in the groove appears at the inactive face of the IC wafer;
  - a dicing step of dicing the protective resin along the line; and
  - a separating and forming step of removing an adhesive member applied to the active face and separating into chip-scale packages.

15. A method for manufacturing a chip-scale package according to claim 14, wherein the projected electrode is a solder bump or a gold bump.

16. A method for manufacturing a chip-scale package according to claim 14, wherein the protective resin is applied so that the projected electrode is exposed in the protective resin applying step.

17. A method for manufacturing a chip-scale package according to claim 14, wherein the protective resin is applied so as to cover the projected electrode in the protective resin applying step, and exposing the projected electrode after grinding the inactive face.

18. A method for manufacturing a chip-scale package according to claim 17, wherein the protective resin is applied so as to cover the projected electrode in the protective resin applying step, applying an adhesive member on a ground face of the IC wafer and, after that, exposing the projected electrode.

19. A method for manufacturing a chip-scale package according to claim 17, wherein the protective resin surface is subjected to an ashing process to expose the projected electrode.

20. A method for manufacturing a chip-scale package according to claim 14, wherein an adhesive member is applied to the inactive face in advance in the groove forming step of forming the groove in the IC wafer, the groove is formed in a state where the IC wafer is fixed by the adhesive member and, after that, the adhesive member is removed.

* * * * *